United States Patent
Hasan

(10) Patent No.: US 7,718,469 B2
(45) Date of Patent: May 18, 2010

(54) ALTERNATIVE METHODS FOR FABRICATION OF SUBSTRATES AND HETEROSTRUCTURES MADE OF SILICON COMPOUNDS AND ALLOYS

(75) Inventor: Mohamed-Ali Hasan, Concord, NC (US)

(73) Assignee: The University of North Carolina at Charlotte

( * ) Notice: Subject to any disclaimer, the term of this patent is extended or adjusted under 35 U.S.C. 154(b) by 344 days.

(21) Appl. No.: 11/074,315

(22) Filed: Mar. 7, 2005

(65) Prior Publication Data

US 2005/0287770 A1 Dec. 29, 2005

Related U.S. Application Data

(60) Provisional application No. 60/550,276, filed on Mar. 5, 2004.

(51) Int. Cl.
*H01L 21/00* (2006.01)
(52) U.S. Cl. .................. 438/105; 438/931; 438/960; 257/E21.102; 257/E21.103
(58) Field of Classification Search ............ 438/960, 438/105, 931, 458, 481, E21.102; 257/E21.102, 257/E21.103
See application file for complete search history.

(56) References Cited

U.S. PATENT DOCUMENTS

| | | | | | |
|---|---|---|---|---|---|
| 4,028,149 | A | * | 6/1977 | Deines et al. | 117/95 |
| 4,910,044 | A | * | 3/1990 | Yamazaki et al. | 427/583 |
| 4,990,988 | A | * | 2/1991 | Lin | 257/215 |
| 5,272,096 | A | | 12/1993 | De Fresart et al. | |
| 5,990,605 | A | * | 11/1999 | Yoshikawa et al. | 313/310 |
| 6,136,699 | A | * | 10/2000 | Inoue | 438/656 |
| 6,221,762 | B1 | * | 4/2001 | Byun et al. | 438/643 |
| 2002/0127820 | A1 | * | 9/2002 | Sato | 438/458 |
| 2002/0190624 | A1 | * | 12/2002 | Sheng et al. | 313/311 |

FOREIGN PATENT DOCUMENTS

DE 198 38 945 A1 3/2000
EP 1 298 234 A2 4/2003

OTHER PUBLICATIONS

Namavar. F. et al., "Investigation of Porous Silicon As A New Compliant Substrate For 3C-SiC Deposition", Materials Science And Engineering B, Elsevier Sequoia, Lausanne, Switzerland, vol. 61-62, Jul. 30, 1999, pp. 61-62.
PCT International Search Report (PCT/US2005/007436) Issued by the EPO Searching Authority mailed Mar. 20, 2006.

* cited by examiner

*Primary Examiner*—Minh-Loan T Tran
(74) *Attorney, Agent, or Firm*—J. Clinton Wimbish; Kilpatrick Stockton, LLP

(57) ABSTRACT

The present invention relates to alternative methods for the production of crystalline silicon compounds and/or alloys such as silicon carbide layers and substrates.

25 Claims, 7 Drawing Sheets

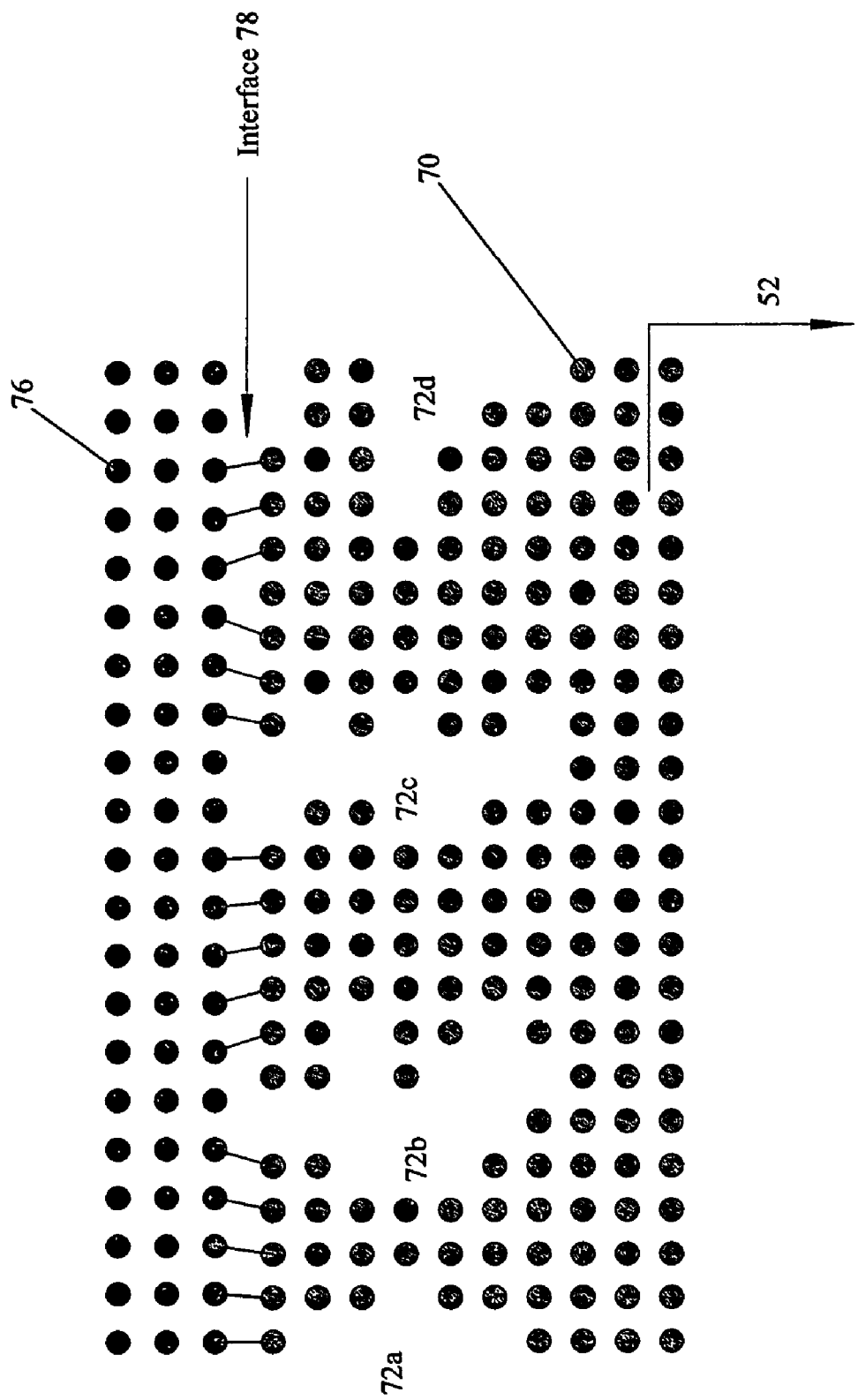

ALTERNATIVE METHODS FOR FABRICATION OF SUBSTRATES AND HETEROSTRUCTURES MADE OF SILICON COMPOUNDS AND ALLOYS

REFERENCE TO RELATED APPLICATIONS

The present application for patent claims priority to U.S. Provisional Patent Application Ser. No. 60/550,276, filed Mar. 5, 2004, which is hereby incorporated in full by reference.

FIELD OF THE INVENTION

The present invention relates to an improved method of fabrication of substrates and layers made of silicon (Si) compounds and alloys through vapor-phase heteroepitaxy as well as alloying and conversion of porous silicon (Si) seeds.

BACKGROUND OF THE INVENTION

Silicon is the most perfected crystalline material among known semiconductors. The abundance of silicon and the capability to fabricate single crystalline silicon wafers as large as 12" have led to economical production and domestication of ultra-large scale integrated (ULSI) circuits and devices used in almost every aspect of our daily life. However, silicon can not meet the demands of high power, high speed, high temperature, and chemically inert devices. In addition, the indirect bandgap of silicon makes silicon an extremely inefficient light emitter.

Integration of other semiconductors on silicon can alleviate some of the problems associated with silicon. An obstacle to integration of other semiconductors on silicon is the large lattice-mismatch of Si compounds and alloys with single crystal Si, which makes it difficult to prepare electronic-grade semiconductors on Si. Silicon compounds such as silicon carbide, silicon silicides, (e.g. chromium silicide, nickel silicide, etc.), silicon germanium ($Si_xGe_{1-x}$), silicon tin ($Si_xSn_{1-x}$), and their ternary alloys are highly sought for a wide range of applications. Economical preparation of electronic grades of these materials as layers on Si or as substrates would trigger new revolutions in the microelectronic/nanoelectronic industry.

SUMMARY OF THE INVENTION

The present invention comprises methods of manufacturing crystalline silicon compound layers and substrates. In one embodiment, a method for the production of a crystalline silicon compound layer comprises heating a porous silicon deposition surface of a porous silicon substrate to a temperature operable for epitaxial deposition of at least one atom or molecule; contacting the porous silicon deposition surface with a reactive gas mixture comprising at least one chemical species comprising a group IV element, and at least one silicon chemical species; and depositing a silicon-group IV element layer on the porous silicon deposition surface.

In another embodiment of the present invention, a method for the production of a silicon compound substrate comprises heating a porous silicon deposition surface of a porous silicon substrate to a temperature operable for epitaxial deposition of at least one atom or molecule; contacting the porous silicon deposition surface with a reactive gas mixture comprising at least one chemical species comprising a group IV element and at least one silicon chemical species; depositing a silicon-group IV element layer on the porous silicon deposition surface; and separating the silicon-group IV element layer from the porous silicon substrate.

In another embodiment, a method for the production of a crystalline silicon silicide layer comprises heating a porous silicon deposition surface of a porous silicon substrate to a temperature operable for epitaxial deposition of at least one atom or molecule; contacting the porous silicon deposition surface with a reactive gas mixture comprising at least one chemical species comprising a transition metal and at least one silicon chemical species; and depositing a silicon silicide layer on the porous silicon surface.

Crystalline silicon compound layers and substrates of the present invention can have less dislocation density compared to direct growth on Si substrate due to accommodation of strain in the porous layer. Moreover, silicon compound layers of the present invention can achieve any desired thickness by utilizing techniques such as chemical vapor deposition, metal organic chemical vapor deposition, or any other means known in the art. Depending on whether the desired endpoint of the process is a hybrid silicon/silicon compound integrated circuit or a silicon compound integrated circuit or component, the silicon seed layer may be removed after final deposition.

BRIEF DESCRIPTION OF THE DRAWINGS

The foregoing and other objects will become more readily apparent by referring to the following detailed description and the appended drawings in which:

FIG. 5 illustrates a result of heteroepitaxial growth of SiC on porous Si according to an embodiment of the present invention.

DETAILED DESCRIPTION

Figure 1:
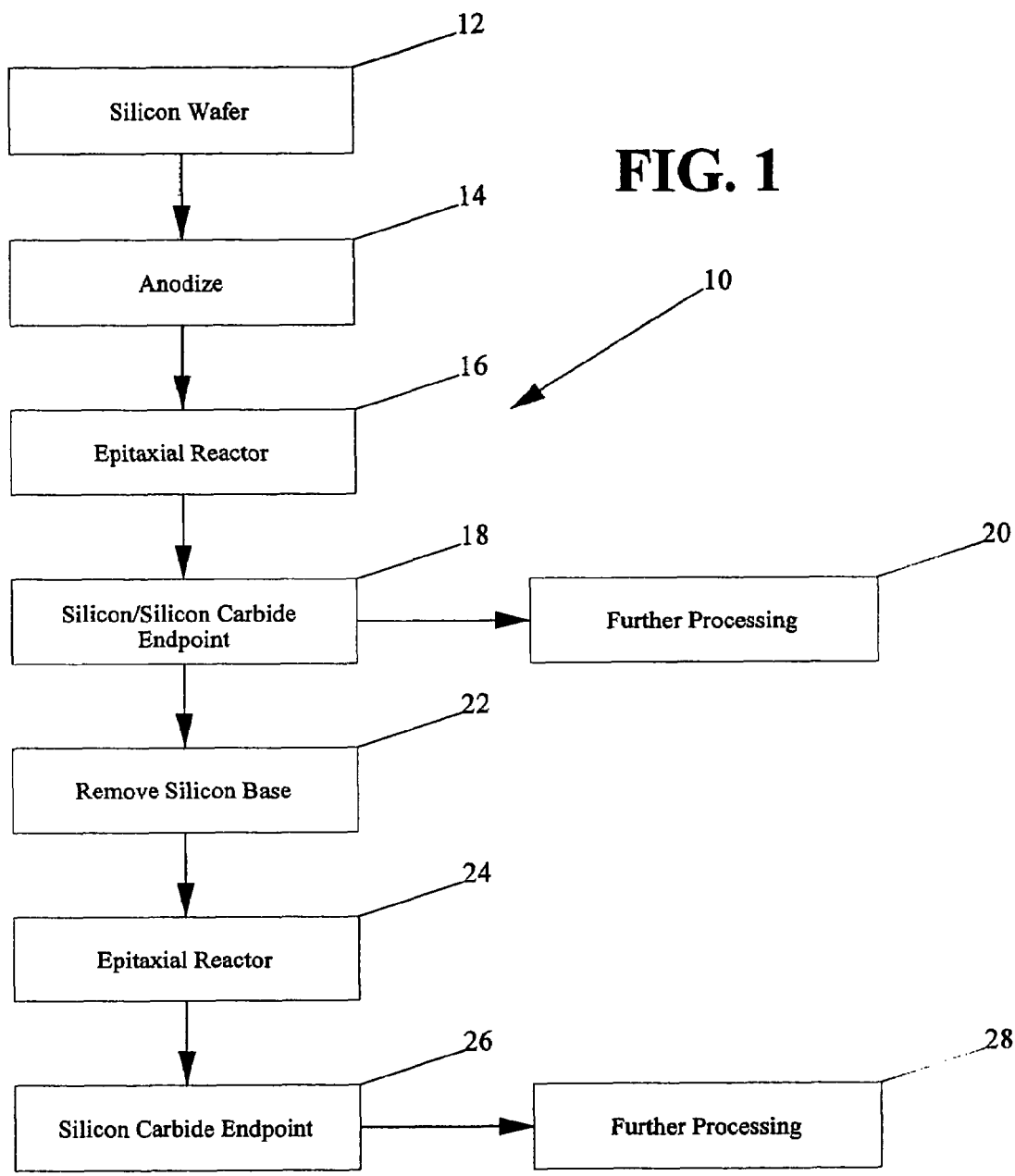
FIG. 1 illustrates a flow chart according to one embodiment of a method of the present invention.

The present invention comprises methods of manufacturing silicon compound crystalline layers and substrates. In one embodiment, a method for the production of a crystalline silicon compound layer comprises heating a porous silicon deposition surface of a porous silicon substrate to a temperature operable for epitaxial deposition of at least one atom or molecule; contacting the porous silicon deposition surface with a reactive gas mixture comprising at least one chemical species comprising a group IV element and at least one silicon chemical species; and depositing a silicon-group IV element layer on the porous silicon deposition surface.

In another embodiment of the present invention, a method for the production of a crystalline silicon compound substrate comprises heating a porous silicon deposition surface of a porous silicon substrate to a temperature operable for epitaxial deposition of at least one atom or molecule; contacting the porous silicon deposition surface with a reactive gas mixture comprising at least one chemical species comprising a group IV element and at least one silicon chemical species; depositing a silicon-group IV element layer on the porous silicon deposition surface; and separating the silicon-group IV element layer from the porous silicon substrate.

In some embodiments, once the silicon-group IV element layer is separated from the porous silicon substrate, further growth of the silicon-group IV element layer can be sustained. Further growth can be sustained by continued epitaxial growth comprising heating the silicon-group IV element layer, contacting the layer with a reactive gas mixture comprising at least one chemical species comprising a group IV element and at least one silicon chemical species, and depositing a silicon-group IV compound on the heated layer.

In embodiments of the present invention, group IV elements correspond to those of group IV of the periodic table comprising carbon, silicon, germanium, tin, and lead.

In another embodiment of the present invention, a method for the production of a silicon silicide layer comprises heating a porous silicon deposition surface of a porous silicon substrate to a temperature operable for epitaxial deposition of at least one atom or molecule; contacting the porous silicon deposition surface with a reactive gas mixture comprising at least one chemical species comprising a transition metal and at least one silicon chemical species; and depositing a silicon silicide layer on the porous silicon surface.

In some embodiments, the present method can further comprise processing the deposited silicon silicide layer to form silicon silicide semiconductor devices. In other embodiments, the deposited silicon silicide layer may be removed from the porous silicon substrate and subsequently processed to form silicon silicide semiconductor devices. In some embodiments where the silicon silicide layer is removed from the porous silicon substrate, further epitaxial growth of the silicon silicide layer can continue by heating the formed silicon silicide layer to a temperature suitable for epitaxial growth, contacting the silicon silicide layer with a reactive gas mixture comprising a chemical species comprising a transition metal, and depositing a silicon silicide on the heated layer.

In some embodiments of methods of the present invention for the production of silicon silicide crystalline layers, transition metals can comprise titanium, chromium, iron, cobalt, nickel, palladium, platinum, and/or molybdenum. In other embodiments, any other transition metal known to one of ordinary skill in the art as suitable for the formation of silicon silicides can be employed.

In some embodiments of the present invention, the porous silicon deposition surface can be heated to a temperature operable for epitaxial deposition of at least one atom or molecule wherein the temperature of the deposition surface can range from about 100° C. to about 1400° C. or greater. In some embodiments of the present invention, the porous silicon deposition surface can be heated to a temperature of ranging from about 100° C. to about 500° C. In other embodiments of the present invention, the porous silicon deposition surface can be heated to a temperature ranging from about 200° C. to about 900° C. In other embodiment of the present invention, the porous silicon deposition surface can be heated to a temperature ranging from about 900° C. to about 1400° C.

In some embodiments where epitaxial growth of the formed silicon compound layer is continued after removal of the layer from the porous silicon substrate, the silicon compound layer can be heated up to about 2700° C. to continue the epitaxial growth.

In some embodiments of the present invention, a reactive gas mixture can comprise trimethylsilanes, methylsilanes, dimethylsilanes, ethylsilanes, diethylsilanes, and/or mixtures thereof. In other embodiments, the reactive gas mixture can comprise $SiH_4$, $SiCl_4$, $SiH_3Cl$, $CH_4$, $C_2H_6$, $GeH_4$, digermane, alkyl germanes, such as ethyl and diethyl germane, $SnH_4$, $SnCl_4$, other metal organics, and/or mixtures thereof. In some embodiments direct deposition of the elements comprising carbon, silicon, germanium, and tin is achieved. In other embodiments, the reactive gas mixture can comprise chemical species comprising cobalt, chromium, platinum, palladium, nickel, iron, titanium, and/or molybdenum operable for the production of silicides.

In some embodiments of the present invention, crystalline silicon-group IV layers can be removed from the porous silicon substrate for further processing into various semiconductor devices. In other embodiments, the crystalline silicon-group IV layers can remain deposited on the porous silicon substrate for further processing into various semiconductor devices.

In some embodiments, methods of the present invention can produce commercial size silicon-group IV substrates, such as SiC, that are compatible with existing semiconductor fabrication tools used in Si technology, enabling economic production of wide band gap semiconductor devices and integrated circuits. Wide band gap devices include radiation-resistant devices, high-power, high-frequency devices, short wavelength electro-optic devices (including blue to ultraviolet sensors and emitters).

In other embodiments, methods of the present invention can produce and integrate islands of silicon-group IV element circuitry on and interconnected with conventional Si integrated circuits. For example, a short wavelength light sensor may be incorporated with longer wavelength silicon light sensors and silicon integrated circuitry for the processing of the signals derived therefrom.

Embodiments of the present invention will now be illustrated in the following non-limiting example.

Example 1

Preparation of a Silicon Carbide Crystalline Layer

Example 1 demonstrates the preparation of a silicon carbide (SiC) crystalline layer according to one embodiment of the present invention. Referring to FIG. 1, a method 10 produces either a SiC wafer endpoint 26 or a SiC island in a Si environment (an hybrid endpoint) 18. A substantially conventional silicon 12 wafer is used as a starting material. Depending on the endpoint, the wafer 12 may be processed directly in an anodization step 14, or, using conventional photolithography means to open discrete locations on the wafer, the silicon wafer may be prepared for the hybrid endpoint 18. The wafer is then anodized according to the method described in detail with regard to FIG. 2. The anodization produces a porous layer of the silicon that consists of a labyrinth of fissures, voids, hillocks, and microscopically rough surfaces. The depth of the voids can be from 10-nm to the full thickness of the wafer. The lateral density of the voids depends on the anodization conditions. The feedstock silicon wafer preferably has one of the conventional lattice orientations, [110], [100] or [111] while the labyrinth of fissures, voids, hillocks, and microscopically rough surfaces exposes every conceivable angular inclination internal to the labyrinth.

The silicon wafer with an anodized surface or islands of anodized regions is introduced to an epitaxial reactor 16. The epitaxial reactor is preferably a chemical vapor deposition (CVD) reactor. The reactants contain at least a carbon-bearing gas and preferably a gas that contains carbon and silicon. CVD can be carried out and a reaction within the labyrinth of fissures, voids, hillocks, and microscopically rough surfaces can take place. The reactant gases can be doped to contain donor or acceptor atoms to create an n-type or p-type endpoint. The energy for the reaction can be supplied by heat, plasma excitation or optical excitation. The reaction temperature has two regimes, at higher temperatures the reaction is dominated by mass transfer and the film growth rate is substantially temperature independent. At lower temperatures the growth rate shows an Arrhenius behavior. Arrhenius behavior means that the growth rate decreases linearly against $1/T$, where $T$ is the temperature in $°K$ and the slope is proportional to $E_A$, the activation energy. The specific temperature for the crossover from the first to second regimes depends on the pressure, reactants and energy source. The values cited hereinafter are typical and not intended to limit the invention in any way.

A 3C—SiC single crystal thin-film is formed using CVD on the porous silicon surface within the labyrinth of fissures, voids, hillocks, and microscopically rough surfaces formed by the anodization step. For example, the silicon substrate may be heated to held at a temperature in the range of about 900° C. through about 1400° C. The silicon source may be $SiH_4$, $SiCl_4$, $(CH_3)_3SiCl$, $(CH_3)_2SiCl_2$, $CH_6S_1$, $C_2H_8Si$ or any other silane gas. The latter four examples provide a single gas source where both Si and C are provided. The carbon source may be $CCl_4$ or a hydrocarbon gas ($C_2H_2$, $C_2H_6$, $CH_4$, $C_3H_8$, etc.) Hydrogen or argon may be used as a carrier gas. A partial pressure of dopant gases may be added to the mix.

A 3C—SiC single crystal thin-film is formed using CVD on the silicon surface within the labyrinth of fissures, voids, hillocks, and microscopically rough surfaces formed by the anodization step. The wafer with the porous surface is reacted with a carbon and silicon-bearing gas such as trimethylsilane (shown) at a temperature from about 900° C. to about 1400° C. to form a SiC layer of any desired thickness. Because the reaction surface consists of a labyrinth of fissures, voids, hillocks, and microscopically rough surfaces formed by the anodization step, conversion to SiC and growth of SiC layer start within the porous layer. The resultant film is substantially stress free because the voids in the porous layer permit alignment of the two crystalline lattices by skipped bonds. If desired, the endpoint film may be doped to form n-type or p-type SiC by the introduction of a partial pressure of gases containing the appropriate dopants. Other suitable carbon and silicon-bearing gases include but are not limited to methylsilane, dimethylsilane, ethylsilane, and diethylsilane.

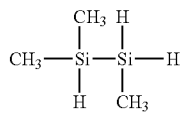

A 3C—SiC single crystal thin-film is formed using CVD on the silicon surface within the labyrinth of fissures, voids, hillocks, and microscopically rough surfaces formed by the anodization step. Carbon atoms may be derived from graphite or hydrocarbon due to the thermal decomposition and diffused into the labyrinthine surfaces on the silicon substrate surface.

In methods of the present invention, the porous Si with its labyrinth of fissures, voids, hillocks, and microscopically rough surfaces formed by the anodization step, acts as an elastic seed for the crystalline growth of the lattice-mismatched material. The labyrinthine structure accommodates the lattice-mismatch virtually minimizing misfit dislocations. This is critical in the development of subsequent devices. For example, high dislocation density implies short carrier lifetimes and thus unsatisfactory circuit performance.

The thickness of the resultant, substantially stoichiometric SiC film can be quite large. It can be made to any desirable thickness by adjusting the growth parameters.

In one embodiment, the endpoint is silicon/silicon carbide implying further processing to form a hybrid integrated circuit. In this case, the SiC is formed in islands in a conventional Si wafer. Further processing includes the formation of SiC devices and circuits operatively interconnected to and integrated with conventional Si circuitry. For example, the short wavelength associated with the wide energy gap of SiC enables blue to ultraviolet light sensors and emitters. Said sensors or emitters may desirably be interconnected with Si integrated circuitry enabling a new range of applications, for example short wavelength fiber-optic communications.

In another embodiment, the endpoint is a SiC substrate. In this case, the entire surface of the silicon wafer feedstock is anodized and rebuilt into a thick (>20 μm) SiC layer and the Silicon is removed by any convenient means, for example mechanically, chemically or thermally. The resultant SiC wafer can be processed to a final thickness in a second epitaxial step yielding a SiC endpoint. Further processing can result in SiC devices or integrated circuits. This low cost SiC substrate can be processed in conventional ways to enable unconventional results that are implied by the large band gap. For example, radiation-resistant integrated circuits are readily fabricated. Further processing may include any of the steps encountered in silicon processing for diffusion of donor or acceptor species. For example, SiC specific structures may use ion implantation.

Figure 2:
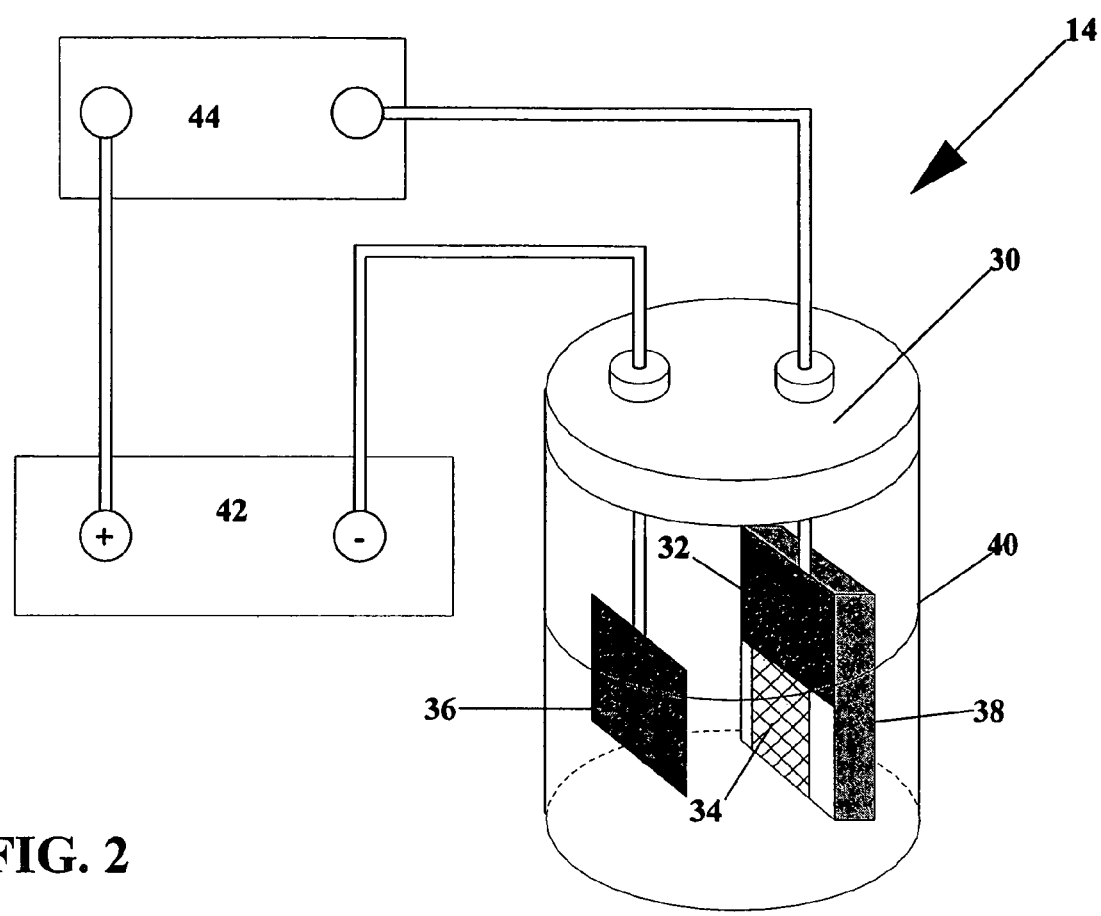
FIG. 2 illustrates an example of an apparatus for forming porous silicon.

FIG. 2 elaborates the principles of the anodization step 14. The anodization produces a porous layer of the silicon that consists of a labyrinth of fissures, voids, hillocks, and microscopically rough surfaces. The anodization may be accomplished in a container 30 that is fabricated from or totally lined with a material that is inert to the electrolyte which is preferably hydrofluoric acid and ethanol. For example, the material may be a tetrafluoroethylene polymer such as Teflon® which is well known as a very chemically inert material over a wide temperature range (−80° C. to 250° C.). The wafer 34 is clamped against a Teflon block 38 and electrically contacted with a tungsten clamp 32 to become the anode. The current density is linearly related to the current since the geometry of the apparatus is fixed. The ammeter 44 is in series with a power supply 42. The negative terminal of the power supply is operatively connected to a tungsten cathode of fixed geometry. Tungsten was chosen because it is extremely stable in an acidic environment such as the HF containing electrolyte. The figure and the description hereabove illustrate the principles of the anodization apparatus. The principles may be embodied in a variety of manufacturing tooling which may or may not superficially resemble the illustration in FIG. 2.

Figure 3:
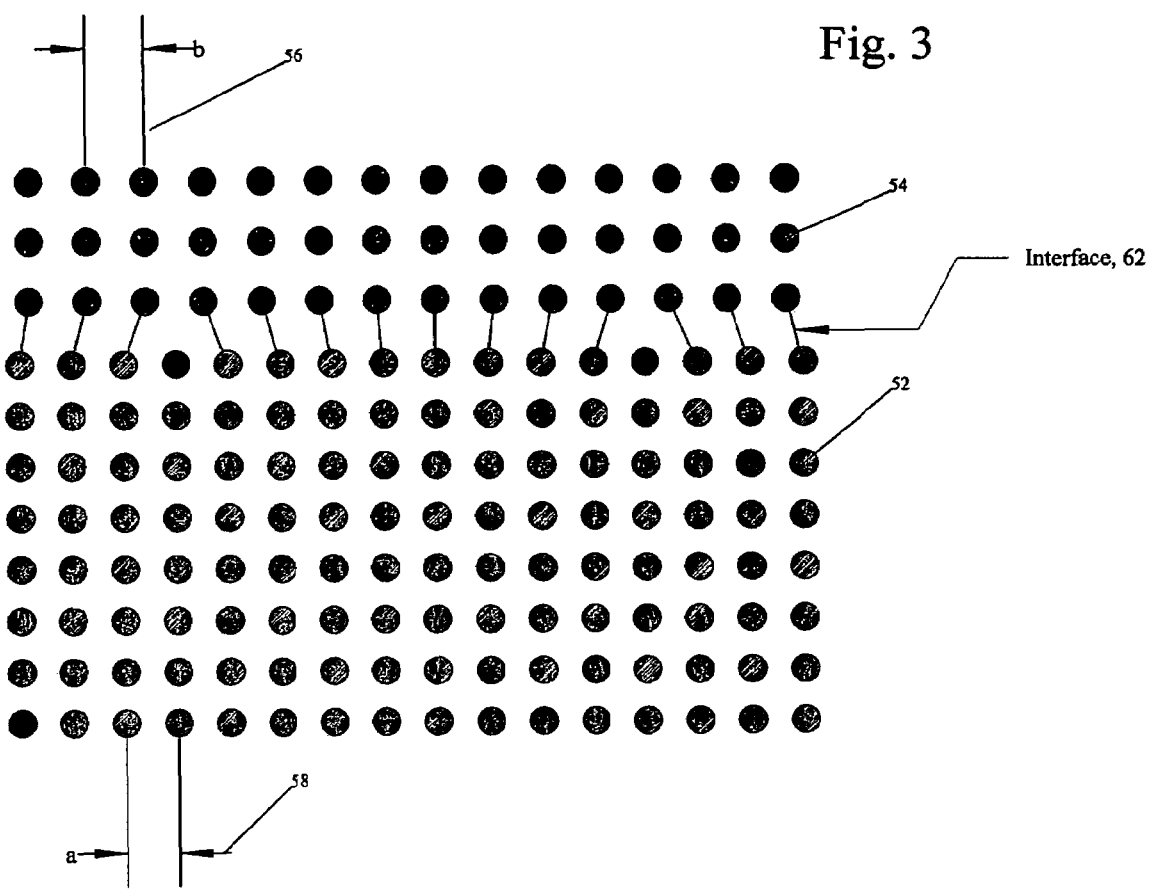
FIG. 3 illustrates prior art of heteroepitaxy of SiC on Si.

Referring to FIG. 3, the effect of heteroepitaxy on silicon according to the prior art is illustrated. The silicon crystal 52 is represented by its lattice points with the lattice constant for silicon represented as "a" 58. The epitaxial layer of SiC 54 is grown on the silicon base. The lattice constant for silicon carbide is represented as "b" 56. The interface 62 between the silicon and the silicon carbide layers illustrate stress bonds as bond on an angle. This lattice constant difference induces many dislocations at the interface 62.

These dislocations exert an adverse effect on the electronic properties of the silicon carbide single crystals obtained and may trigger the formation of stacking faults in the crystal, thereby making it difficult to obtain silicon carbide semiconductor devices with excellent characteristics. Moreover, silicon carbide single crystals have a tendency to contain crystal defects referred to as antiphase boundaries, thereby making it difficult to produce silicon carbide semiconductor devices at desired positions on a silicon substrate. Previous attempts at epitaxial growth of SiC on Si have met with limited success. For example, minority carrier lifetimes have been impractically short. The maximum obtainable thickness of the resultant films have been impractically thin for the separation of a stand-alone SiC wafer.

Figure 4:
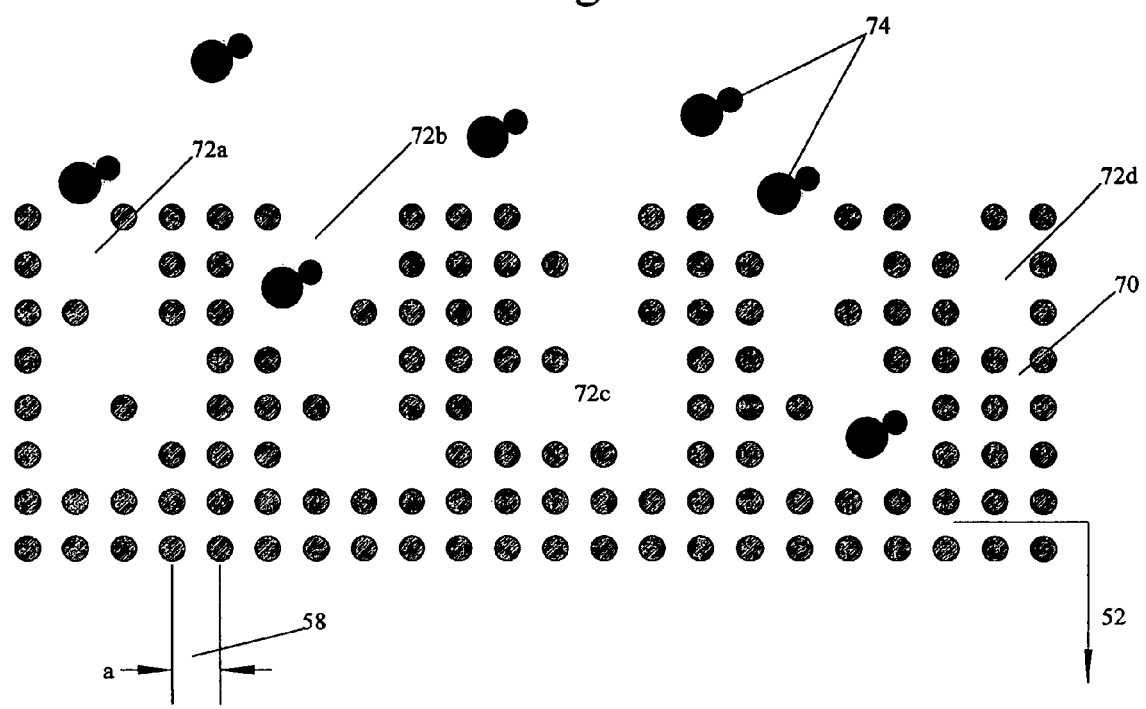
FIG. 4 illustrates heteroepitaxial growth of SiC on porous Si according to an embodiment of the present the invention.

FIG. 4 illustrates the silicon substrate 70 by its lattice points according to this invention. The surface of the silicon where silicon carbide is desired has been anodized leaving porous Si with its labyrinth of fissures, voids, hillocks and microscopically rough surfaces. As in FIG. 3, the lattice constant is represented by "a" 58. In the epitaxial reactor, a silicon and carbon-bearing gas such as trimethylsilane 74 reacts with the silicon substrate as in FIG. 3. However, the surface of the silicon confronting the reactive gas has been prepared with multiple voids 72a, 72b and 72c. The voids allow the reacting gas to penetrate the confronting surface. The irregular internal surface permits the SiC reactants to penetrate into the porous layer and react laterally to form SiC while at the same time accommodating the resulting strain due to the lattice mismatch. The small dimension of Si in the porous layer and presence of voids provide the mechanism by which strain is accommodated.

Moreover, the SiC material can bridge voids and continue to grow to form a continuous layer. A feature of CVD is that the reactant gas can penetrate the labyrinthine surface in such a way that the reaction takes place on the internal surfaces. As the reaction builds through the labyrinth, the voids partially fill and are finally bridge with substantially strain-relieved SiC. It should be noted that contamination can be a source of poor results in CVD reactors. The wafers are placed in the reactor vessel, the reactant gases are introduced with a carrier gas that is inert in the reaction. As the reactants are depleted, their partial pressure must be maintained by providing make-up gas as the reaction proceeds. In some CVD reactors, the gas may become contaminated due to the inadvertent introduction of materials from the inside walls of the vessel. Known ways to ameliorate said contamination problems such as "cold wall" CVD may be applied here. The term "cold wall" refers to the common case wherein the wafer and its support are heated while keeping the container walls cold. The advantage is that the walls do not substantially evolve contaminating materials during the film growth.

FIG. 5 shows the effect of a porous silicon substrate 70 confronting the epitaxial SiC layer. The pores permit stress-relieving gaps 72a, 72b, 72c, and 72d in the bonds allowing the bonds to restart at minimum energy pinning points. As a result, the epitaxial film 76 is substantially free of the strain and defects such as dislocations and stacking faults described under FIG. 3. Note that the bonds at the interface 78 are now substantially relaxed.

Figure 6A:
FIG. 6(a) displays preliminary cross-sectional scanning electron microscopy results of a silicon carbide layer produced according to an embodiment of a method of the present invention.
Figure 6B:
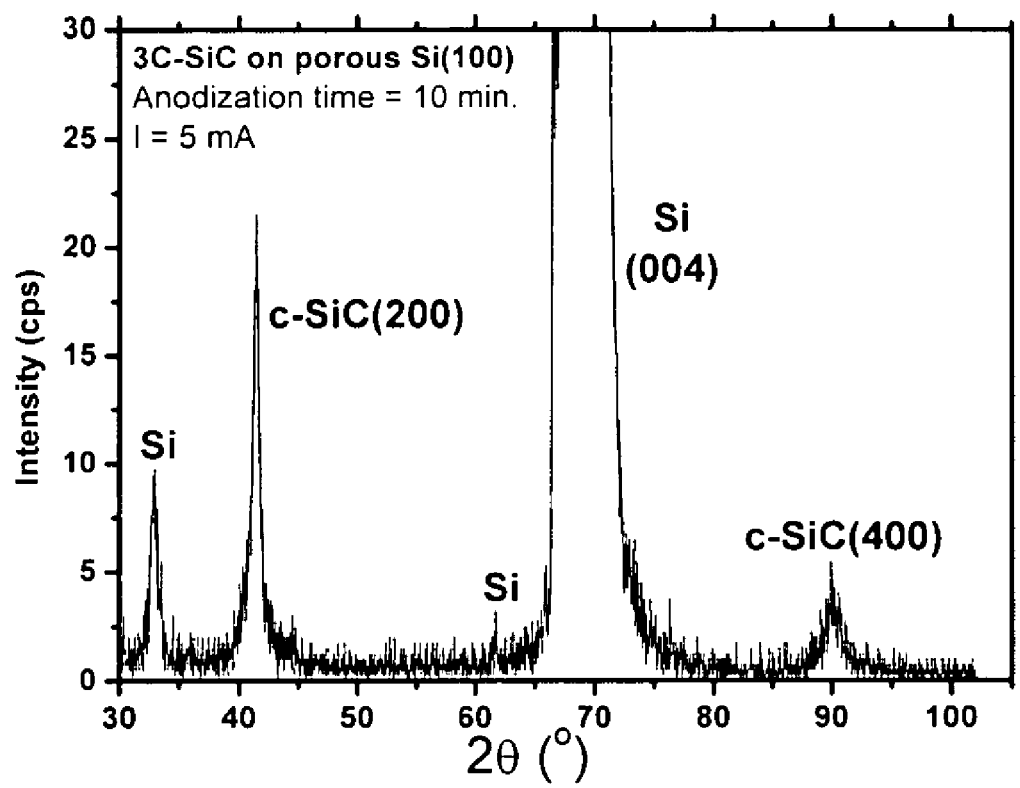
FIG. 6(b) displays x-ray diffraction results of a silicon carbide layer produced according to an embodiment of a method of the present invention.

FIG. 6 shows specific results from a specific realization of this invention using scanning electron microscopy (SEM) and X-ray diffraction. These results do not represent a final process. However, important conclusions related to this invention can be made out of the figures. The SEM image shows a cross-sectional image of SiC on Si. In this case, the growth process parameters were tuned to lead to self separation of the SiC layer from the Si (Note the gap between the two layers). The SiC layer can be easily separated by twisting the wafer with respect to the layer. The X-ray results shows only one orientation Si(100). This is demonstrated by the peaks from the two equivalent SiC(200) and SiC(400) orientations that are parallel to the [100] direction. There are no measurable traces of any other orientation. This is a clear indication that the SiC is single crystalline layer grown along the [100] direction.

A 3C-silicon carbide layer produced by one embodiment of methods of the present invention can avoid problems that result from the fact the lattice constant of silicon single crystals is different from that of silicon carbide single crystals by as much as 20%. In unimproved methods, the lattice constant difference induces a high density of misfit dislocations as well as stacking faults generated on the [111] planes within the silicon carbide single crystals grown on the silicon single-crystal substrate. Both misfit dislocations and stacking faults exert an adverse effect on the electronic properties of the silicon carbide single crystals obtained, thereby making it difficult to obtain silicon carbide semiconductor devices with desired and reproducible characteristics.

In some embodiments of the present invention, the crystalline silicon carbide layers can comprise cubic silicon carbide. In other embodiments of the present invention, the crystalline silicon carbide layers can comprise hexagonal silicon carbide.

Additionally methods of the present invention can produce commercial size silicon carbide substrates that are compatible with existing semiconductor tooling, enabling economic production of wide band gap semiconductor devices and integrated circuits that include radiation-resistant devices, high-power, high frequency devices, short wavelength electro-optic devices (including blue to ultraviolet sensors and emitters); moreover, the present invention can provide methods to integrate islands of SiC circuitry on and interconnected with conventional Si integrated circuits.

It is to be understood that the foregoing description and specific embodiments are merely illustrative of the best mode of the invention and the principles thereof, and that various modifications and additions may be made to the apparatus by those skilled in the art, without departing from the spirit and scope of this invention, which is therefore understood to be limited only by the scope of the appended claims.

That which is claimed is:

1. A method for the production of a crystalline silicon compound layer comprising:
   heating a porous silicon layer of a porous silicon substrate to a temperature operable for epitaxial deposition of at least one atom or molecule, the porous silicon layer having an irregular and microscopically rough structure;
   contacting the porous silicon layer with a reactive gas mixture comprising at least one chemical species comprising a group IV element and at least one silicon chemical species; and
   depositing a silicon-group IV element layer within the porous silicon layer, wherein the porous silicon layer has a thickness of at least 10 nm.

2. The method of claim 1, wherein the silicon-group IV element layer comprises silicon carbide, silicon germanium, or silicon tin.

3. The method of claim 1, wherein the porous silicon layer is heated to a temperature ranging from about 100° C. to about 1400° C.

4. The method of claim 1, further comprising processing the silicon-group IV element layer to form silicon-group IV semiconductor devices.

5. The method of claim 4, wherein the processing comprises removing the deposited silicon-group IV layer from the porous silicon substrate.

6. The method of claim 4, wherein the silicon-group IV element crystalline layer comprises silicon carbide, silicon germanium, or silicon tin.

7. The method of claim 6, wherein the silicon carbide comprises cubic silicon carbide.

8. The method of claim 6, wherein the silicon carbide comprises hexagonal silicon carbide.

9. The method of claim 1, wherein the reactive gas mixture comprises methylsilane, dimethylsilane, ethylsilane or diethylsilane or combinations thereof.

10. The method of claim 1, wherein the reactive gas mixture comprises alkyl germanes or $GeH_4$ or combinations thereof.

11. The method of claim 10, wherein alkyl germanes comprise ethylgermane or diethylgermane or combinations thereof.

12. The method of claim 1, wherein the reactive gas mixture comprises $SnH_4$ or $SnCl_4$ or combinations thereof.

13. The method of claim 1, wherein the silicon-group IV element layer comprises Si—Ge.

14. The method claim 1, wherein the silicon-group IV element comprises Si—Sn.

15. The method of claim 1, wherein the silicon-group IV element comprises Si—C—Ge, Si—Ge—Sn, Ge—Sn, Si—C—Sn, Si—C—Pb, or Si—Ge—Pb.

16. The method of claim 1, wherein the silicon-group IV element comprises Si—C—Sn—Pb—Ge.

17. The method of claim 1, wherein the irregular and microscopically rough structure of the porous silicon layer is adapted to reduce defects in the silicon-group IV element layer.

18. The method of claim 1 further comprising growing the silicon-group IV element layer outside the porous silicon layer.

19. A method for the production of a crystalline silicon compound substrate comprising:
   heating a porous silicon layer of a porous silicon substrate to a temperature operable for epitaxial deposition of at least one atom or molecule;
   contacting the porous silicon layer with a reactive gas mixture comprising at least one chemical species comprising a group IV element and at least one silicon chemical species;
   depositing a silicon-group IV element layer within the porous silicon layer, wherein the porous silicon layer has a thickness of at least 10 nm; and
   separating the silicon-group IV element layer from the porous silicon substrate.

20. The method of claim 19, wherein the silicon-group IV element layer comprises silicon carbide, silicon germanium, or silicon tin.

21. The method of claim 19, wherein the porous silicon layer is heated to a temperature ranging from about 100° C. to about 1400° C.

22. The method of claim 19, further comprising processing the silicon-group IV element layer to form silicon-group IV element semiconductor devices.

23. The method of claim 22, wherein the silicon-group IV element substrate comprises silicon carbide, silicon germanium, or silicon tin.

24. The method of claim 23, wherein the silicon carbide comprises cubic silicon carbide.

25. The method of claim 23, wherein the silicon carbide comprises hexagonal silicon carbide.

* * * * *